United States Patent [19]

Lee

[11] Patent Number: 5,506,522
[45] Date of Patent: Apr. 9, 1996

[54] DATA INPUT/OUTPUT LINE SENSING CIRCUIT OF A SEMICONDUCTOR INTEGRATED CIRCUIT

[75] Inventor: Jong-Hoon Lee, Suwon, Rep. of Korea

[73] Assignee: Samsung Electronics Co., Ltd., Suwon, Rep. of Korea

[21] Appl. No.: 254,587

[22] Filed: Jun. 6, 1994

[30] Foreign Application Priority Data

Jun. 5, 1993 [KR] Rep. of Korea .................. 10143/1993

[51] Int. Cl.$^6$ ........................................... H03F 3/45
[52] U.S. Cl. ................ 327/53; 326/58; 327/55; 327/185
[58] Field of Search .................. 327/51, 52, 54, 327/58, 394, 398, 408, 437, 544, 55, 57, 185, 53; 326/122, 58

[56] References Cited

U.S. PATENT DOCUMENTS

| | | | |
|---|---|---|---|
| 4,354,257 | 10/1982 | Varshney et al. | 327/51 |
| 4,932,002 | 6/1990 | Houston | 327/51 |
| 4,973,864 | 11/1990 | Nogami | 327/52 |
| 5,029,136 | 7/1991 | Tran et al. | 327/51 |
| 5,231,319 | 7/1993 | Crafts et al. | 327/277 |
| 5,311,070 | 5/1994 | Dooley | 327/437 |
| 5,334,890 | 8/1994 | Hardee | 327/51 |

*Primary Examiner*—Timothy P. Callahan
*Assistant Examiner*—My-Trang Nu Ton
*Attorney, Agent, or Firm*—Cushman Darby & Cushman

[57] ABSTRACT

A data input/output line sensing circuit includes a latch sense circuit having the double functions of performing a latch operation and a sensing operation for data read from a memory cell. The latch sense circuit includes a first inverter having an input end connected to one of the data input/output lines, and an output end connected to the other of the data input/output lines; a first switching transistor provides the first inverter with a power supply voltage and a ground voltage only during a sensing operation in response to a sensing control signal; a second inverter having an input end connected to the output of the first inverter, and an output end connected to the input of the first inverter; and a second switching transistor provides the second inverter with the power supply voltage and the ground voltage only during the sensing operation in response to the sensing control signal.

9 Claims, 3 Drawing Sheets

DATA INPUT/OUTPUT LINE SENSING CIRCUIT OF A SEMICONDUCTOR INTEGRATED CIRCUIT

BACKGROUND OF THE INVENTION

The present invention relates to semiconductor integrated circuits, and more particularly to a data input/output line sensing circuit for transferring data read from a memory cell to a data output buffer and for amplifying data represented in the form of a voltage difference.

Recently, as the density of semiconductor memory devices has increased, the size of the unit memory cells has decreased. The reduction of the memory cell size requires a lower power supply voltage for protecting elements. For example, a power supply voltage of 3.3V is typically used in a dynamic RAM of the 64 Mbit class, while a power supply voltage of 5V is typically used in a dynamic RAM of the 16 Mbit class. However, a lower power supply voltage delays the time required for sensing data represented in the form of the voltage difference, because the lower power supply voltage leads to a reduced data voltage difference. Particularly, in a high density semiconductor memory, it is required to provide a data input/output line sensing circuit which can transfer data of a weak voltage difference read from a memory cell at a high speed to a data output buffer on the same chip.

FIG. 1 shows a conventional data input/output line sensing circuit employed in a 4 Mbit dynamic RAM made by the Samsung Co. Ltd. The circuit includes a first differential amplifier 70A, a second differential amplifier 70B, a precharge circuit 70C, a latch 70D and an output driver 70E. In FIG. 1, the data sensing operation is performed in two steps; one by the first differential amplifier 70A and the other by the second differential amplifier 70B. The first differential amplifier 70A, the second differential amplifier 70B and the precharge circuit 70C are all enabled or disabled by a signal φS which is generated with a predetermined time delay after column gate transistors for connecting/disconnecting bit lines with data input/output lines are turned on. The signal φS is generally known in the art as a sensing circuit actuating signal. In the conventional circuit, the signal φS is at the logic "low" state before the data input/output line sensing circuit is enabled. This turns off the respective pull-down transistors 10 and 30 in the first and second differential amplifier 70A and 70B, thereby disabling the sensing operation. However, precharge transistors 42 and 44 in precharge circuit 70C are turned on, thereby providing the "high" state to input lines of latch 70D. Consecutively, the outputs of latch 70D are held at the "low" level. At a result, output driver 70E is kept at a high impedance state or tri-state. In the meantime, when the data input/output line sensing circuit is enabled, signal φS is changed to the "high" level. Then, precharge transistors 42 and 44 of precharge circuit 70C are turned off. Memory data is read from a cell array (not shown), causing a voltage difference in the voltage levels at the input/output lines IO and $\overline{IO}$. The voltage difference between the input/output lines IO and $\overline{IO}$ is then amplified by the first differential amplifier 70A, and the amplified voltage difference output at lines 62 and 64 is again differentially amplified by the second differential amplifier 70B. The voltage difference between lines 66 and 68 is fully developed to the CMOS level. Further, depending upon the voltage levels of lines 66 and 68, complementary output data DO and $\overline{DO}$ is output through the output driver 70E.

It is noted that in the conventional data input/output line circuit, the sensing operation is divided into two steps and current is consumed in each step. Therefore, the conventional circuit is disadvantageous because of the current consumption may. Further, since a sensing operation is performed in each step, the sensing operation cannot be performed at a high speed. Because of these problems, the conventional data input/output line sensing circuit is considered unsuitable for high density and high speed semiconductor memory devices with low current consumption.

SUMMARY OF THE INVENTION

It is therefore an object of the present invention to provide a data input/output line sensing circuit suitable for high density semiconductor memory devices with low current consumption.

It is another object of the present invention to provide a data input/output line sensing circuit performing a sensing operation at a high speed.

It is still another object of the present invention to provide a data input/output line sensing circuit performing a sensing operation at a high speed, reducing current consumption.

According to the present invention, a data input/output line sensing circuit includes a latch sense circuit having the double functions of performing a latch operation and a sensing operation for data read from a memory cell.

A data input/output line sensing circuit in a semiconductor integrated circuit, according to an aspect of the present invention, has at least a pair of data input/output lines for transferring data read from a memory cell, and includes a first inverter having an input end connected to one of the data input/output lines, and an output end connected to the other of the data input/output lines. The invention further includes a first switching means for providing the first inverter with a power supply voltage and a ground voltage only during a sensing operation in response to a sensing control signal. A second inverter is provided which has an input end connected to the output of the first inverter, and an output end connected to the input of the first inverter. A second switching means selectively provides the second inverter with the power supply voltage and the ground voltage only during the sensing operation in response to the sensing control signal.

BRIEF DESCRIPTION OF THE DRAWINGS

The above and other objects, advantages and features of the present invention will be more apparent from the following detailed description taken in conjunction with the attached drawings in which.

DETAILED DESCRIPTION OF PRESENTLY PREFERRED EMBODIMENTS

In the following description, "data input/output line sensing circuit" refers to a circuit formed between a cell array and a data output buffer which amplifies a voltage difference on bit lines preamplified by a bit line sense amplifier, and supplies the amplified voltage difference to the data output buffer. Further, "latch sense circuit" refers to a circuit having the structure of a latch, but having the function of a sense amplifier.

Figure 2:
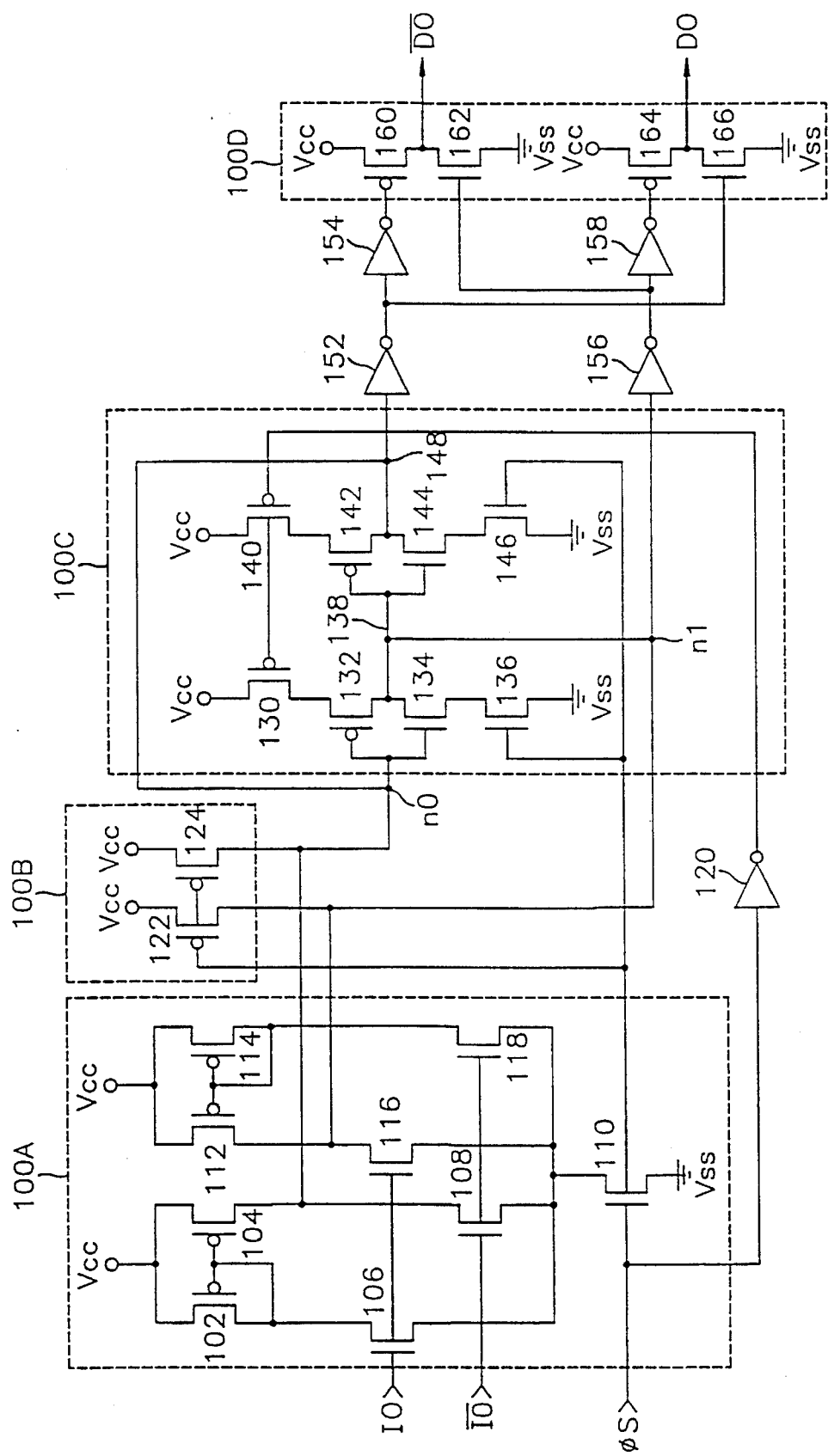
FIG. 2 is a circuit diagram showing an embodiment of a data input/output line sensing circuit according to the present invention.

Referring to FIG. 2, the data input/output line sensing circuit according to one embodiment of the present invention includes a differential amplifier circuit 100A receiving a driving signal φS and connected to data input/output lines IO and $\overline{\text{IO}}$, a precharge circuit 100B providing a precharge voltage to the output lines of the differential amplifier circuit 100A in response to the driving signal φS, a latch sense circuit 100C receiving the driving signal φS and the output signals of the differential amplifier circuit 100A, and an output driver circuit 100D connected to the output of the latch sense circuit 100C. As shown in FIG. 2, the latch sense circuit 100C has input and output lines which are connected to each other.

The latch sense circuit 100C includes a PMOS transistor 132 and an NMOS transistor 134 serially connected to each other, the gates thereof commonly connected to an output node n0 of differential amplifier circuit 100A. The source of PMOS transistor 132 is connected to the drain of PMOS transistor 130 whose source is connected to the power supply voltage Vcc. The driving signal φS is connected to a gate of PMOS transistor 130 through inverter 120. The source of NMOS transistor 134 is connected to the drain of NMOS transistor 136 whose source is connected to ground voltage Vss. The signal φS is connected to the gate of NMOS transistor 136. A common connection node 138 of PMOS transistor 132 and NMOS transistor 134 is connected to the output node n1 of differential amplifier circuit 100A. The channels of PMOS transistor 142 and NMOS transistor 144, whose gates are commonly connected to node 138, are serially connected to each other. The source of PMOS transistor 142 is connected to a drain of PMOS transistor 140 whose source is connected to the power supply voltage Vcc. The driving signal φS is connected to the gate of PMOS transistor 140 through inverter 120. The source of NMOS transistor 144 is connected to the drain of NMOS transistor 146 whose source is connected to the ground voltage Vss. The driving signal φS is connected to the gate of NMOS transistor 146. A common connection node 148 of PMOS transistor 142 and NMOS transistor 144 is connected to the node n0.

According to the present invention, when the data driving signal φS is at the "low" level, the input/output line sensing circuit is disabled. In this state, pull-down transistor 110 of differential amplifier circuit 100A and the respective pull-down transistors 136 and 146 of latch sense circuit 100C are all turned off, and a sensing operation is not performed. Also, the respective pull-up transistors 130 and 140 of the latch sense circuit 100C are turned off, thereby reducing unnecessary current consumption during this stand-by state. Further, the precharge transistors 122 and 124 of precharge circuit 100B are turned on, thereby providing a "high" level to nodes n0 and n1 connected to the input lines of the latch sense circuit 100C. The output drivers 160, 162, 164, and 166 connected to nodes n0 and n1 through the inverters 152, 154, 156, and 158 are kept at a high impedance state or tri-state. As mentioned above, when the data input/output line sensing circuit is disabled, unnecessary current consumption is reduced by the latch sense circuit 100C.

When the data input/output line sensing circuit is enabled, the driving signal φS goes to the activated level, for example, the logic "high" level and precharge transistors 122 and 124 of precharge circuit 100B are turned off. Here, the input/output lines IO and $\overline{\text{IO}}$, onto which data read from the cell array (not shown) is loaded, are initially precharged to, for example, a Vcc-$V_T$ level. In this precharge state, the voltage levels at the input/output lines IO and $\overline{\text{IO}}$ become differentiated upon the reading of data. Then, pull-down transistor 110 of the differential amplifier circuit 100A and the respective pull-down transistors 136 and 146 of the latch sense circuit 100C are all turned on by the driving signal φS at the "high" level, thereby enabling the sensing operation. Also, pull-up transistors 130 and 140 of the latch sense circuit 100C are turned on, thereby supplying the power supply voltage Vcc to the sources of pull-up transistors 132 and 142, which have channels connected in series thereto respectfully.

Figure 1:
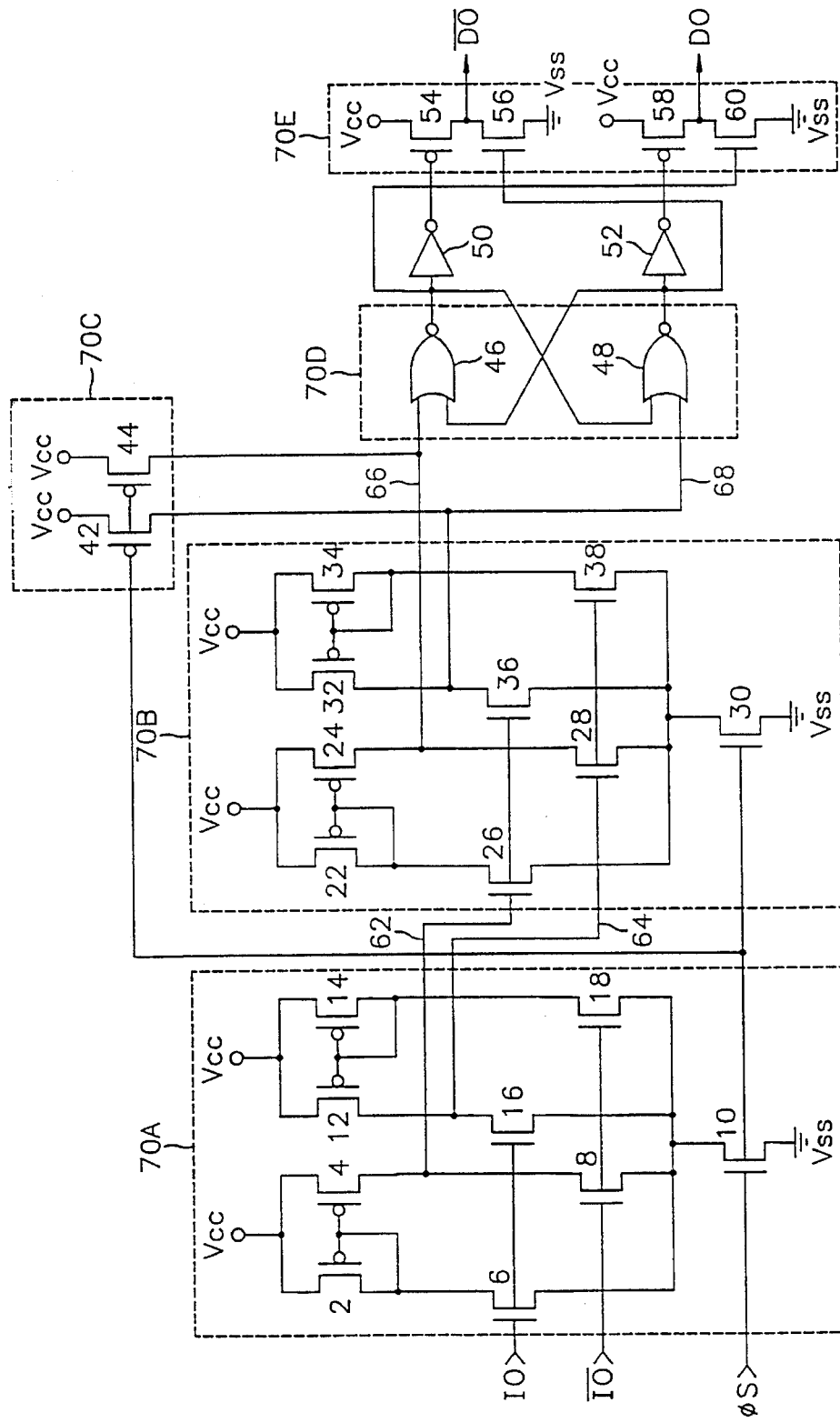
FIG. 1 is a circuit diagram showing a conventional data input/output line sensing circuit.
Figure 3:
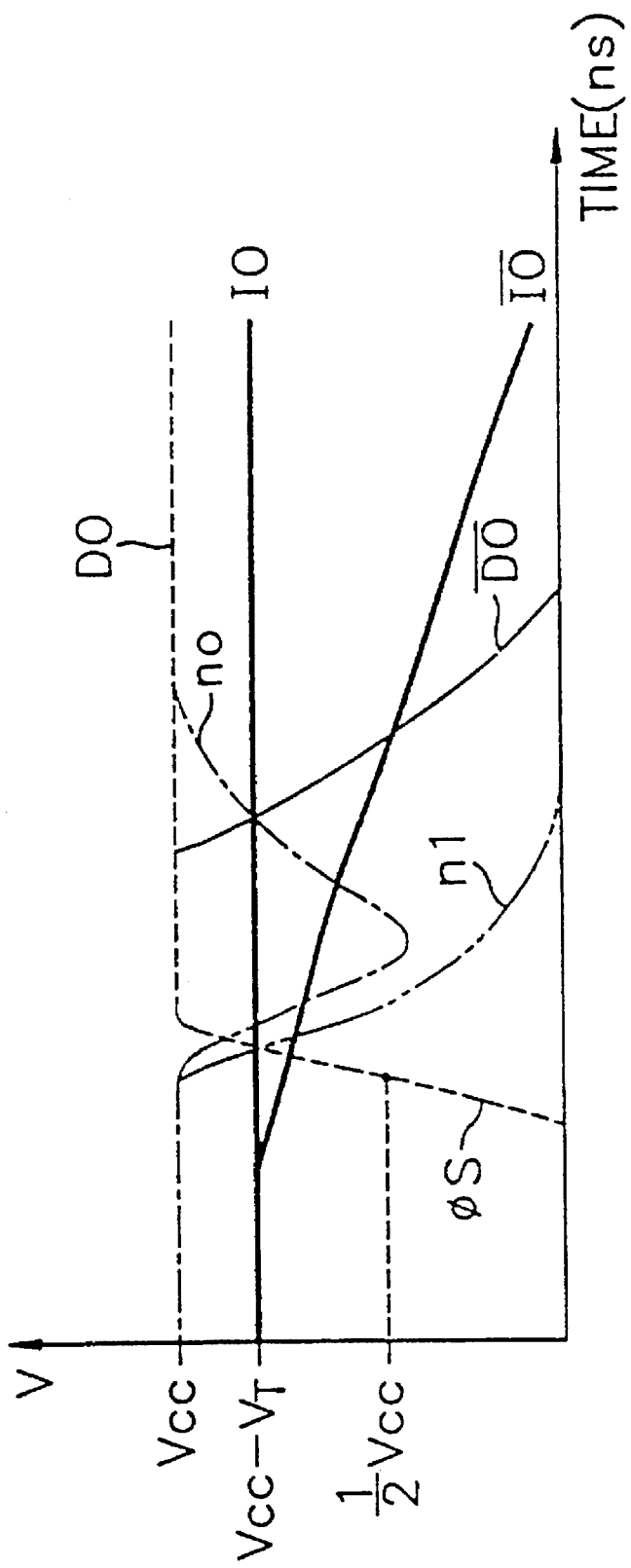
FIG. 3 is an operational timing diagram showing the sensing characteristics of the data input/output line sensing circuit of FIG. 2 according to the present invention.

As shown in FIG. 3, the input/output lines IO and $\overline{\text{IO}}$ which were precharged to Vcc-VT are developed upon receiving data read from a memory cell. Then, nodes n0 and n1 respectively go to the "high" and "low" levels by the differential amplifying operation of differential amplifier circuit 100A. Transistors 130, 132, 134 and 136 and transistors 140, 142, 144 and 146 operate as inverters, respectively. Therefore, line 138 goes to the "low" level and the node n1 also goes to the "low" level. Consecutively, the line 148 goes to the "high" level and node n0 is kept at the "high" level. Then, the "high" state and the "low" state of a stable CMOS level are output by the data output lines DO and $\overline{\text{DO}}$ through output driver 100D. The sensing operation can be performed at a high speed, because the differential amplifying operation, divided in two steps in the conventional device of FIG. 1, is a single-step operation. Also, according to the present invention, nodes n0 and n1 are kept at a stable voltage level by latch sense circuit 100C, thereby keeping the output of data lines DO and $\overline{\text{DO}}$ stable. Further, since pull-up transistors 130 and 140 and pull-down transistors 136 and 146 of latch sense circuit 100C are turned on only when a sensing operation is performed, current consumption is reduced during the stand-by state.

As mentioned above, the data input/output line sensing circuit according to the present invention includes a differential amplifying process of data read from the cell array and a latch sensing process, thereby operating at a high speed and reducing the current consumption. Also, since the output is kept stable by the latch sensing operation, the operational stability of the semiconductor integrated circuit may be improved.

The data input/output line sensing circuit shown and described is an illustrative embodiment of the present invention. It will be appreciated by those skilled in the art that many modifications may be made to the data input/output line sensing circuit of the present invention. For example, the differential amplifier circuit can be replaced with another voltage amplifier circuit having a different circuit constitution. Further, the precharge circuit and the output driver can be replaced with other equivalent circuits within the scope of the present invention. The latch sense circuit can be also replaced with a different logic circuit as long as it performs a latch operation and a sensing operation and is disabled during the stand-by state. Other modifications may be made without departing from the spirit and scope of the invention, as defined by the appended claims and their equivalents.

What is claimed is:

1. A data input/output line sensing circuit in a semiconductor integrated circuit having at least one pair of differential data input/output lines for transferring data read from a memory cell to a plurality of data output lines, comprising:

a differential amplifier connected to said one pair of differential data input/output lines and having first and second differential amplifier output lines, said differential amplifier amplifying said data read from said memory cell and providing said amplified data to said first and second differential amplifier output lines in response to an activation state of a sensing control signal;

a precharge circuit to precharge said first and second differential amplifier output lines of said differential amplifier to a predetermined precharge voltage level in response to a non-activation state of said sensing control signal;

a latch sense circuit having a first state being a non-enabled state and a second state being an enabled and activated state, said latch sense circuit including first and second input nodes connected respectively to said first and second differential amplifier output lines of said differential amplifier and a latch sense circuit output line, said latch sense circuit being placed in said non-enabled state by said non-activation state of said sensing control signal to provide a latched output of said amplified data on said latch sense circuit output line; and an output driver circuit connected to said latch sense circuit output line of said latch sense circuit.

2. The data input/output line sensing circuit according to claim 1, wherein said latch sense circuit comprises:

a first inverter having a first inverter input connected to said first differential amplifier output line, and having a first inverter output connected to said second differential amplifier output line;

first switching means for providing said first inverter with a power supply voltage and a ground voltage only when said sensing control signal is in said activated state;

a second inverter having a second inverter input connected to said first inverter output, and a second inverter output connected to said first inverter input; and second switching means for providing said second inverter with said power supply voltage and said ground voltage only when said sensing control signal is in an activated state.

3. The data input/output line sensing circuit according to claim 1, wherein:

said latch sense circuit is placed in said non-activated state by a non-activated state of said sensing control signal to provide a high impedance output on said latch sense circuit output line.

4. The data input/output line sensing circuit according to claim 3, wherein said latch sense circuit comprises:

a first inverter having a first inverter input connected to said first differential amplifier output line, and having a first inverter output connected to said second differential amplifier output line;

a first switch connected between said first inverter and a power supply voltage, said first switch providing said first inverter with said power supply voltage only when said sensing control signal is in an activated state;

a second inverter having a second inverter input connected to said first inverter output, and a second inverter output connected to said first inverter input; and a second switch connected between said second inverter and said power supply voltage, said second switch providing said second inverter with said power supply voltage only when said sensing control signal is in an activated state.

5. The data input/output line sensing circuit according to claim 4, wherein said first switch comprises:

a first transistor of said first switch operating in response to said activation of said sensing control signal and having a channel connected between a first end of said first inverter and a first terminal of said power supply voltage; and a second transistor of said first switch operating in response to said activation of said sensing control signal and having a channel connected between a second end of said first inverter and a second terminal of said power supply voltage.

6. The data input/output line sensing circuit according to claim 4, wherein said second switch comprises:

a first transistor of said second switch operating in response to said activation of said sensing control signal and having a channel connected between a first end of said first inverter and a first terminal of said power supply voltage; and a second transistor of said second switch operating in response to said activation of said sensing control signal and having a channel connected between a second end of said first inverter and a second terminal of said power supply voltage.

7. The data input/output line sensing circuit according to claim 5, wherein said second switch comprises:

a first transistor of said second switch operating in response to said activation of said sensing control signal and having a channel connected between a first end of said first inverter and a first terminal of said power supply voltage; and a second transistor of said second switch operating in response to said activation of said sensing control signal and having a channel connected between a second end of said first inverter and a second terminal of said power supply voltage.

8. A data input/output line sensing circuit in a semiconductor integrated circuit having one pair of differential data input/output lines for transferring data read from a memory cell to a plurality of data output lines, comprising:

differential amplifier means, connected to said one pair of differential data input/output lines and having first and second differential amplifier output lines, for amplifying said data read from said memory cell and providing said amplified data to said first and second differential amplifier output lines in response to an activation state of a sensing control signal;

precharge circuit means for precharging said first and second differential amplifier output lines of said differential amplifier means to a predetermined precharge voltage level in response to a non-activation state of said sensing control signal;

latch sense means having a first state being a non-enabled state and a second state being an enabled and activated state, said latch sense means including first and second input nodes connected respectively to said first and second differential amplifier output lines of said differential amplifier and a latch sense circuit output line, said latch sense means being placed in said non-enabled state by said non-activation state of said sensing control signal to provide a latched output of said amplified data on said latch sense circuit output line; and output driver means, connected to said latch sense output line of said latch sense circuit, for driving said latched amplified data.

9. The data input/output line sensing circuit according to claim 8, wherein said latch sense means comprises:

first inverter means, having a first inverter input connected to said first differential amplifier output line, and having a first inverter output connected to said second differential amplifier output line, for firstly inverting said amplified data;

first switching means for providing said first inverter means with a power supply voltage only when said sensing control signal is in said activated state;

second inverter means, having a second inverter input connected to said first inverter output, and a second inverter output connected to said first inverter input, for secondly inverting said firstly inverted amplified data; and second switching means for providing said second inverter means with said power supply voltage only when said sensing control signal is in an activated state.

* * * * *